United States Patent [19]
Chengson et al.

[11] Patent Number: 5,999,437
[45] Date of Patent: Dec. 7, 1999

[54] PROCESSOR-INCLUSIVE MEMORY MODULE

[75] Inventors: David P. Chengson, Aptos; William L. Schmidt, Los Gatos; Unmesh Agarwala, San Jose; Alan D. Foster, Los Altos; Edward C. Priest, San Jose; John C. Manton, Mountain View; Ali Mira, San Jose, all of Calif.

[73] Assignee: Silicon Graphics, Inc., Mountain View, Calif.

[21] Appl. No.: 08/789,557

[22] Filed: Jan. 27, 1997

Related U.S. Application Data

[62] Division of application No. 08/589,532, Jan. 22, 1996.

[51] Int. Cl.$^6$ ..................................................... H05K 1/14
[52] U.S. Cl. ............................ 365/52; 361/760; 361/761; 361/764; 361/792
[58] Field of Search ..................................... 361/790, 792, 361/760, 761, 764; 395/307; 29/834; 365/52

[56] References Cited

U.S. PATENT DOCUMENTS

| | | |
|---|---|---|
| 5,315,482 | 5/1994 | Tanaka et al. ............................ 361/707 |
| 5,400,220 | 3/1995 | Swamy ..................................... 361/760 |
| 5,412,538 | 5/1995 | Kikinis et al. ............................ 361/792 |
| 5,446,960 | 9/1995 | Isaacs et al. .............................. 29/834 |
| 5,535,342 | 7/1996 | Taylor ...................................... 395/307 |

FOREIGN PATENT DOCUMENTS

| | | | |
|---|---|---|---|
| 0 504 411 A1 | 9/1990 | European Pat. Off. | ......... H01L 23/50 |
| 0 392 892 | 10/1990 | European Pat. Off. | .......... G11C 5/00 |
| 0 398 188 A2 | 11/1990 | European Pat. Off. | .......... G11C 5/00 |
| 0 446 367 A1 | 9/1991 | European Pat. Off. | .......... G05B 11/01 |
| 0 543 565 A1 | 5/1993 | European Pat. Off. | .......... G11C 5/00 |
| 0 660 399 A2 | 6/1995 | European Pat. Off. | ....... H01L 23/367 |
| 0 661 747 A1 | 7/1995 | European Pat. Off. | ...... H01L 25/065 |
| 0 680 249 A2 | 11/1995 | European Pat. Off. | .......... H05K 7/20 |
| 90 15 468 U | 3/1991 | Germany | ......................... H05K 1/14 |

OTHER PUBLICATIONS

Paquin, Kurt. "Motorola Inc.: Motorola Technical Developments." vol. 18. Schaumburg, Il. Mar. 18, 1993.
"IBM Technical Disclosure Bulletin: Novel Memory Card." vol. 37. Oct. 10, 1994.
IBM Corp., "High Performance Package", Aug. 1985, IBM Disclosure Bulletin, vol. 28, No. 3, pp. 1020–1021.

*Primary Examiner*—Viet Q. Nguyen
*Attorney, Agent, or Firm*—Wagner, Murabito & Hao

[57] ABSTRACT

A processor-inclusive memory module (PIMM) is disclosed. In one embodiment of the present invention, the PIMM includes a printed circuit board having first and second opposing surfaces. The printed circuit board also has an address line formed therein. A first SRAM is mounted on the first surface of the printed circuit board. The present PIMM is further comprised of a second SRAM mounted on the second surface of the printed circuit board. The second SRAM is mounted on the second surface of the printed circuit board directly opposite the first SRAM mounted on the first surface of the printed circuit board. The first and second SRAMs are coupled to the address line by respective cache buses. A processor is also mounted on the first surface of the printed circuit board, and is coupled to the address line. In one embodiment of the invention, a heat sink is thermally coupled to the processor. The processor has a plurality of contact pads disposed thereon. Electrical connectors extend from the second surface of the printed circuit board. The electrical connectors are electrically coupled to respective contact pads of the processor. In the present PIMM, the electrical connectors are adapted to be removably attached to a mother board. In so doing, the present PIMM is removably attachable to a mother board.

8 Claims, 5 Drawing Sheets ated Apr. 21, 1993 entitled "High Memory Capacity DRAM SIMM."

PROCESSOR-INCLUSIVE MEMORY MODULE

This application is a divisional application of Ser. No. 08/589,532, filed on Jan. 22, 1996.

TECHNICAL FIELD

The present invention pertains to computer memory and processors. Specifically, the present invention relates to a socketable computer memory and processor module.

BACKGROUND ART

It is currently possible to increase or "upgrade" computer memory using memory modules. An example of a memory module is a single in-line memory module or "SIMM." A SIMM is typically comprised of a printed circuit board with at least one memory component such as a RAM, SRAM, DRAM, and the like attached thereto. The SIMM also commonly includes a multi-pin/pad single in-line connector for connecting the SIMM to the device being upgraded. A detailed description of such a SIMM is found in commonly owned U.S. Pat. No. 5,272,664 to Alexander et al., filed Apr. 21, 1993 entitled "High Memory Capacity DRAM SIMM." U.S. Pat. No. 5,272,664 is incorporated herein by reference.

Prior Art FIG. 1 is a side cut away view of a pair of SIMMs 10 and 12 conventionally mounted to a mother board 14. Each of SIMMs 10 and 12 include a memory component 16 and 18, respectively. Memory components 16 and 18 are attached to substrates 20 and 22, respectively. SIMM 10 is attached to mother board 14 via edge connector 24. Similarly, SIMM 12 is attached to mother board 14 via edge connector 26. A processor 28 with a heat sink 30 coupled thereto is bonded to mother board 14.

As shown by Prior Art FIG. 1, an extended bus is required for processor 28 to access memory components 16 or 18. That is, in the prior art, signals traveling from processor 28 to SIMM 10, for example, must travel from processor 28 along an address line present in mother board 14. The signals must continue to travel along the address line through mother board 14 and to edge connector 24 up into substrate 20. The signals then travel along a cache bus in substrate 20 of SIMM 10. The cache bus extends from edge connector 24 to memory component 16.

In the prior art, component layouts generate long "routing distances" between the processor and SIMMs thereby necessitating such extended address line lengths. As shown in Prior Art FIG. 1, heat sink 30 extends beyond the periphery of processor 28. Thus, heat sink 30 prevents SIMMs 10 and 12 from being placed directly next to processor 28. It will be seen from Prior Art FIG. 1, that memory components 16 and 18 are separated from mother board 14 by at least the height of edge connector 24. Thus, the cache buses must extend at least from the memory component and through the vertical length of the edge card connector. Additionally, as processors generate greater quantities of waste heat, heat sinks become larger to dissipate the waste heat. As a result, prior art SIMMs are pushed farther from the processor by the protruding edges of the ever-larger heat sinks. Thus, prior art address line lengths and cache bus lengths are extended. Furthermore, passing signals form the mother board to the SIMM via the card edge connector creates electrical continuity problems.

Increased address line run lengths and cache bus lengths also inhibit the speed at which signals are effectively transferred. More specifically, as address lines and cache buses lengthen, transmission line effects increase. In the prior art, extended address line and cache bus lengths generate transmission line effects which limit effective signal speeds to well under 200 MHz. Furthermore, simultaneous switching noise generated as a result of the numerous outputs from prior art SIMMs to the mother board creates tremendous transient current. The transient current passes through parasitic inductance and generates noise on ground. Noise on ground is highly undesirable because all voltage signals are referenced to ground. Although prior art SIMMs have several limitations, the SIMMs still possess substantial utility. As an example, the "socketability" or replaceability of the SIMMs is an advantageous feature. Thus, even if substantial improvements are made over existing prior art memory modules, socketability features should be retained.

Thus, a need exists for a memory module which does not require extended address lines or cache buses, a memory module which is capable of operating at high speeds up to 200 MHz, and a memory module which is socketable.

DISCLOSURE OF THE INVENTION

It is therefore an object of the present invention to provide a memory module which does not require extended address lines or cache buses, a memory module which is capable of operating at high speeds up to 200 MHz, and a memory module which is socketable. The above objects have been achieved by a processor-inclusive memory module (PIMM).

The processor-inclusive memory module (PIMM) of the present invention includes a printed circuit board having first and second opposing surfaces. The printed circuit board also has an address line formed therein. A first SRAM is mounted on the first surface of the printed circuit board. The first SRAM is coupled to the address line by a short first cache bus. The present PIMM is further comprised of a second SRAM mounted on the second surface of the printed circuit board. In one embodiment, the first and second SRAMs are synchronous SRAMs (SSRAMs). The second SRAM is coupled to the address line by a short second cache bus. Furthermore, the second SRAM is mounted on the second surface of the printed circuit board directly opposite the first SRAM mounted on the first surface of the printed circuit board. A processor is also mounted on the first surface of the printed circuit board, and is coupled to the address line. The processor has a plurality of contact pads disposed thereon. Electrical connectors extend from the second surface of the printed circuit board. The electrical connectors are electrically coupled to respective contact pads of the processor. In the present PIMM, the electrical connectors are adapted to be removably attached to a mother board. In so doing, the present PIMM is removably attachable to a mother board. Additionally, by using short cache buses, the first and second SRAMs access said address line using said first and second cache buses at a speed of up to 200 MHz.

In another embodiment of the present invention, the PIMM includes four SRAMs mounted to a first surface of the printed circuit board. Furthermore, an additional four SRAMs are mounted to the other side of the printed circuit board, directly opposite of the first four SRAMs mounted on the first surface of the printed circuit board. The SRAMs are fashioned from a clam-shelled BGA configuration. This allows a pair of vertically aligned SRAMs on either side of the Circuit board to share the same via. Since the top and bottom SRAMs can share the same via, the number of required vias is minimized. As a result, this greatly reduces blockages and delays, while enhancing signal integrity. The present embodiment also includes a tag SRAM mounted to the printed circuit board.

In yet another embodiment of the present invention, a heat sink is thermally coupled to the processor. For further enhancing heat dissipation the present invention also includes an embodiment wherein the second SRAM is thermally coupled to the mother board.

In still another embodiment of the present invention, the PIMM includes actual probes and probe test points disposed on the printed circuit board for setting clock taps and for testing the processor and the first and second SRAMs.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 2:
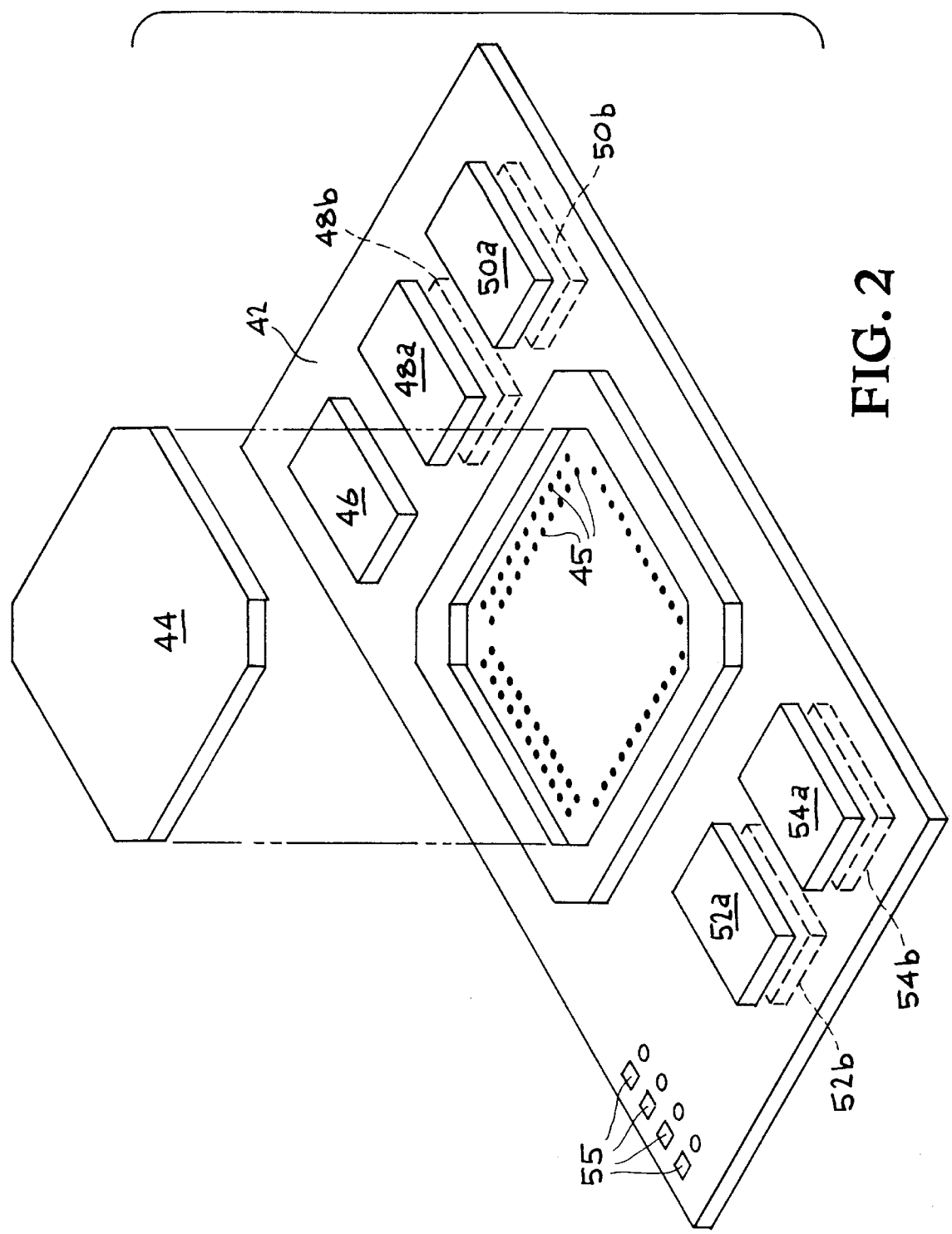
FIG. 2 is a cut-away, partially exploded, perspective view of the top surface of a processor-inclusive memory module (PIMM) in accordance with the present claimed invention.

With reference now to FIG. 2, a cut-away perspective view of the top surface of the present processor-inclusive memory module (PIMM) 40 is shown. PIMM 40 consists of a substrate 42 having a processor 44 and nine memory components (46, 48a, 48b, 50a, 50b, 52a, 52b, 54a, and 54b) mounted thereon. In the present embodiment, substrate 42 is a printed circuit board, and processor 44 is an R10000 (R10K) processor by Silicon Graphics of Mountain View, Calif. Memory components (46, 48a, 48b, 50a, 50b, 52a, 52b, 54a, and 54b) are synchronous static random access (SSRAM) components which form, for example, either a 1 MB or 4 MB secondary cache for processor 44. In the present embodiment, memory components 48a, 48b, 50a, 50b, 52a, 52b, 54a, and 54b are 64K×18 SSRAM's used for secondary cache, while memory component 46 is a 32k×36 SSRAM which provides cache coherency. SSRAMs 46, 48a, 48b, 50a, 50b, 52a, 52b, 54a, and 54b have the following characteristics:

Synchronous pipeline mode of operation with self timed late write;

Single differential HSTL clock;

HSTL input and output levels;

Registered addresses, write enables, sync select, data in;

Registered outputs;

Programmable impedance output drivers;

Byte write capability;

Boundary scan using limited set of JTAG 1149.1 functions; and

Speed capability from 133 MHz to 200 MHz depending on requirements.

Thus, the present invention provides both memory components and a processor on a single socketable substrate. In so doing, the present PIMM allows a user to independently test the memory components and the processor before the PIMM is incorporated into a larger system. The socketability of the present PIMM further provides convenient replaceability. That is, the present PIMM is easily removable from the larger system to, for example, add additional memory, replace a memory component or processor, upgrade the processor, and the like. Although specific substrate, processor, and memory components are recited in the present embodiment, the present invention is also well to the use of other types of substrates, processors, and memory components.

Referring still to FIG. 2, in the present embodiment, substrate 42 is approximately 4.6 inches long and 2.6 inches wide. Processor 44 is centrally mounted on substrate 42. Specifically, processor 44 is contained in a ceramic package with the contact pads, not shown, disposed on the bottom of processor 44 and arranged in a Land Grid Array (LGA) package of 599 pins. The ceramic package size is 47.5 mm×47.5 mm. The ceramic LGA package is inserted into low inductance spring contact socket 45 attached to substrate 42. Each of the contact pads of processor 44 is electrically coupled to a respective low inductance spring contact, typically shown as 45. Electrical connection between contact pads of processor 44 and respective low inductance spring contacts 45 occurs when processor 44 is compressed into low inductance spring contact socket 47. The low inductance spring contacts 45 provide multiple parallel conductive paths to each of the contact pads of processor 44. In the present embodiment, low inductance spring contacts 45 are CIN::APSE Button-Only contacts manufactured by Cinch of Elk Grove Village, Ill. It will be understood by those of ordinary skill in the art that the present invention is also well suited to the use of other types of low inductance electrical connections between processor 44 and substrate 42.

Figure 3:
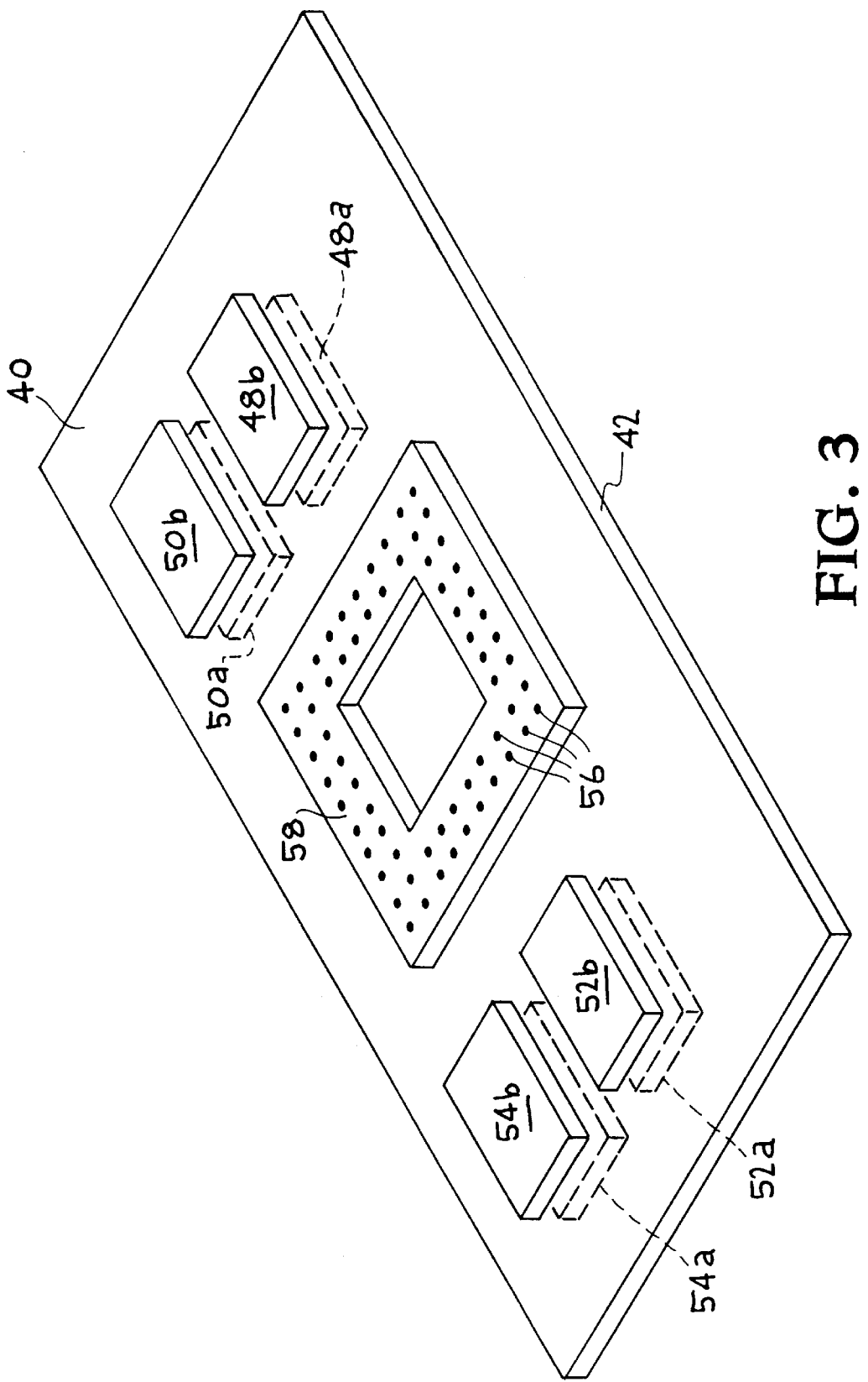
FIG. 3 is a cut-away perspective view of the bottom surface of processor-inclusive memory module (PIMM) in accordance with the present claimed invention.

With reference next to FIG. 3, a cut-away perspective view of the bottom surface of PIMM 40 is shown. Electrical connectors, typically shown as 56, extend from the bottom surface of another low inductance spring contact 58. Each of electrical connectors 56 is electrically couplable through substrate 42 to a respective low inductance spring contact 45 of FIG. 2, and thus to a respective contact pad of processor 44. Electrical connectors 56 are adapted to be removably inserted into a mother board, not shown. The following list provides sample electrical connector (pin) names and functions for the present PIMM.

| Pin Name: | Function: |
| --- | --- |
| SYSCLK | Differential LVPECL processor clock |
| SYSREQ_ | System request |
| SYSGNT_ | System grant |
| SYSREL_ | System release |
| SYSRDRDT_ | System read ready |
| SYSWRRDY_ | System write ready |
| SYSCMD[11:0] | System command |
| SYSCMDPAR | System command parity |
| SYSAD[63:0] | System address/data bus |
| SYSADCHK[7:0] | System address/data check bus |
| SYSVAL_ | System valid |
| SYSSTATE[1:0] | System state bus |
| SYSSTATEVAL_ | System state bus valid |
| SYSRESP[4:0] | System response bus |
| SYSRESPPAR | System response bus parity |
| SYSRESPVAL_ | System response bus valid |
| SYSRESET_ | System reset |
| SYSNMI_ | System non maskable interrupt |
| SYSCORERR_ | System correctable error |
| SYSSUNCERR_ | System uncorrectable error |
| SYSGBLPERF_ | System globally performed |
| SYSCYC_ | System cycle |
| JTDI | JTAG serial data in to R10000 |
| JTDI1 | JTAG serial data in to SSRAM chain |
| JTCK | JTAG clock to R10000 |
| JTCK1 | JTAG clock to SSRAM chain |
| JTMS | JTAG mode select to R10000 |
| JTMS1 | JTAG mode select to SSRAM chain |
| JTDO | JTAG serial data out from R10000 |
| JTDO1 | JTAG serial data out from SSRAM chain |
| SERIAL_PROM | Line to read contents of serial prom |
| VCCOK | VCC is OK |

Therefore, the present PIMM is removably attachable to a mother board. As a result, the present invention signals passes signals between processor 44 and mother board 42. In the present embodiment, electrical connectors 56 of low inductance spring contact 58 are CIN::APSE Plunger-Button contacts manufactured by Cinch of Elk Grove Village, Ill. Again, it will be understood by those of ordinary skill in the art that the present invention is also well suited to the use of other types of low inductance electrical connectors. Thus, the present invention provides a low-inductance PIMM. That is, the present PIMM is a controlled inductance module which eliminates inductance problems associated with the prior art.

With reference again to FIG. 2, SSRAMs 48a and 48b, SSRAMs 50a and 50b, SSRAMs 52a and 52b, SSRAMs 54a and 54b, are mounted on opposing surfaces of substrate 42 in a "clam shell" fashion. That is, SSRAM 48a, as an example, is mounted on the top surface of substrate 42, while SSRAM 48b is mounted on the bottom surface of substrate 42 directly opposite SSRAM 48a. Likewise, SSRAM 50a, is mounted on the top surface of substrate 42 with SSRAM 50b mounted on the bottom surface of substrate 42 directly opposite SSRAM 50a, and so on. In the present embodiment, SRAMS 46, 48a, 48b, 50a, 50b, 52a, 52b, 54a, and 54b are mounted to substrate 42 using a Ball Grid Array (BGA) configuration. More specifically, in the present embodiment, SRAMS 46, 48a, 48b, 50a, 50b, 52a, 52b, 54a, and 54b, are mounted to substrate 42 in a 119 pin BGA of dimension 14 mm×22 mm using a 7×17 matrix BGA configuration. Power requirements in the present embodiment for SRAMS 46, 48a, 48b, 50a, 50b, 52a, 52b, 54a, and 54b include a VDD of 3.3 volts to 3.6 volts, and a VDDQ of 1.4 volts to 1.6 volts. When SRAMS 46, 48a, 48b, 50a, 50b, 52a, 52b, 54a, and 54b are operating at 200 MHz, power output is approximately 2.3 watts.

With reference still to FIG. 2, the clam shell BGA attachment of SRAMS 46, 48a, 48b, 50a, 50b, 52a, 52b, 54a, and 54b to substrate 42 makes it difficult to access the address, data, and clock nets of SRAMS 46, 48a, 48b, 50a, 50b, 52a, 52b, 54a, and 54b. The present PIMM includes probe test points typically shown as 55 which allow a user of the present PIMM to test SRAMS 46, 48a, 48b, 50a, 50b, 52a, 52b, 54a, and 54b, without having to access address, data, and clock nets in a typical manner. In the currently preferred embodiment, very small 950 ohm resistors (not shown), are coupled on-board to the test points 55. Thereby, applying a 50 ohm transmission line test cable to the 950 ohm resistive test pads, provides 20:1 passive test probes. In alternative embodiments, active test probes can be implemented in place of the passive test probes. These test probes operate at very high frequencies, in the order of several gigahertz (GHz). The importance of having these high frequency test probes is to provide a mechanism for determining the proper clock delays. Since a single clock is used to clock the data to both the SSRAMs and processor 44, there exist different set-up and hold times which need to be met. A programmable read-only memory (PROM) contains information relating to a set of mode bits. These mode bits are used to control the selection amongst a range of different clock taps. The clock taps are selected according to the particular configuration of individual computer systems. Because different configurations require different clock frequencies, a variety of clock taps are used to grant the ability of varying the clock delays to the desired frequencies.

Figure 4:
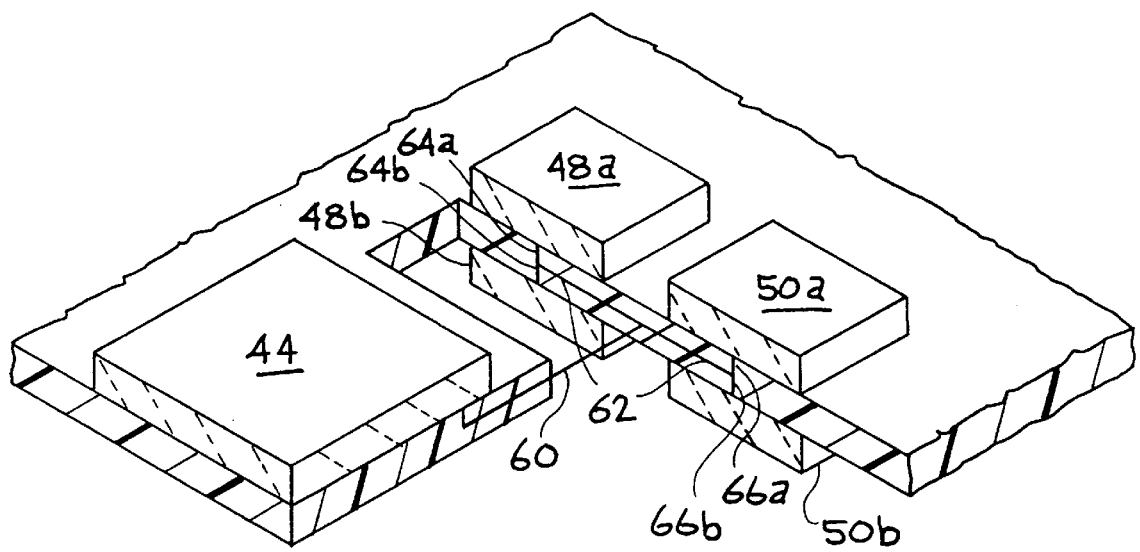
FIG. 4 is a partial cut-away view illustrating address and cache bus lines of the present processor-inclusive memory module (PIMM) in accordance with the present claimed invention.

With reference next to FIG. 4, a partial cut-away view illustrating address and cache bus lines of the present PIMM is shown. By mounting SRAMs 46, 48a, 48b, 50a, 50b, 52a, 52b, 54a, and 54b in a clam shell configuration, the present invention provides several benefits. As shown in FIG. 4, in the present embodiment, a portion of an electrically conductive path (address line) 60 extends through substrate 42. Address line portion 60 is electrically coupled to processor 44. Address line portion 60 extends to a location between SSRAMs 48a, 48b, 50a, 50b. At the aforementioned location between SSRAMs 48a, 48b, 50a, 50b, address line portion 60 is coupled to a second address line portion 62 which is perpendicular to address line portion 60. Thus, address line portions 60 and 62 form a T-shape. In one direction, address line portion 62 extends to between SSRAMs 48a and 48b. in the other direction, address line portion 62 extends to between SRAMS 50a and 50b. As shown in FIG. 4, a very short electrically conductive path (cache bus) 64a electrically couples SRAM 48a to address line portion 62. Also, a very short electrically conductive path (cache bus) 64b electrically couples SRAM 48b to address line portion 62. Similarly, at the other end of address line portion 62, very short electrically conductive paths (cache buses) 66a and 66b electrically couple SRAMs 50a and 50b, respectively to address line portion 62. Although not shown in FIG. 4, similar short cache bus configurations couple SRAMs 52a, 52b, 54a, and 54b to a T-shaped address line.

Figure 1:
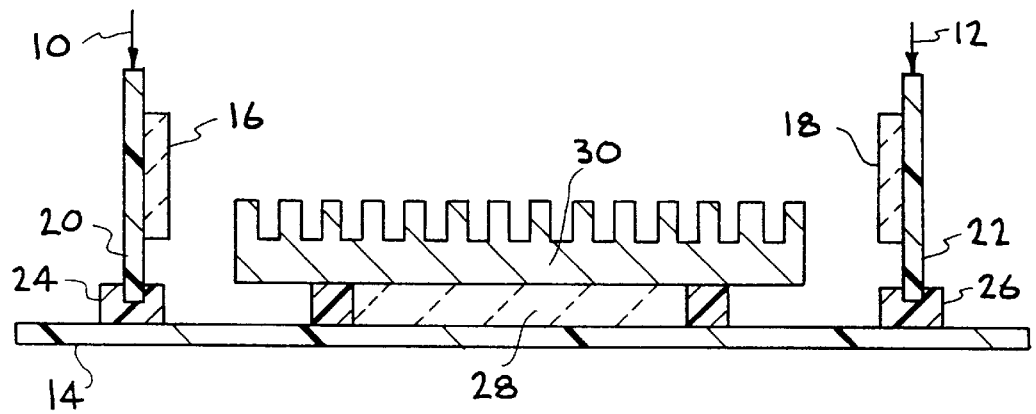
FIG. 1 is a side cut away view of a pair of Prior Art SIMMs conventionally mounted to a mother board.

With reference still to FIG. 4, the present PIMM eliminates the extended address lines or cache buses found in the prior art. That is each of SSRAMs 46, 48a, 48b, 50a, 50b, 52a, 52b, 54a, and 54b, is coupled to a centrally located address line by a very short cache bus. Instead have having a cache bus which extends from a SSRAM all the way to the processor, the present PIMM reduces the cache bus length to just long enough to couple the SSRAM to the centrally located address line. Furthermore, instead of using numerous circuitous address lines, the present PIMM employs a single centrally located address line to communicate with four SSRAMs. By substantially reducing address line and cache bus lengths, the present PIMM eliminates significant speed limiting transmission line effects associated with the prior art. Thus, unlike the prior art, the present PIMM provides cache lines which can operate up to 200 MHz. Additionally, unlike the prior art which requires the memory module to communicate via a system bus to a processor, all communication between the processor and SRAMs 46, 48a, 48b, 50a, 50b, 52a, 52b, 54a, and 54b takes place on the present PIMM. Because, all high speed, i.e. 200 MHz, secondary cache signals remain on the present PIMM, the present invention simplifies routing of the mother board to which the PIMM is removably coupled. The simplified routing allows a less complex mother board having fewer layers to be used. The simplified routing schemes, and less complex mother board provides substantial cost reductions to end users of the present PIMM. Furthermore, because 200 MHz signals operate on the present PIMM, the present invention eliminates electrical discontinuity problems associated with the prior art. More specifically, the present invention eliminates the need for high speed signals to pass through an electrical connector such as connectors 24 and 26 of Prior Art FIG. 1.

As an additional benefit, in the present invention all communication between processor 44 and SSRAMs 46, 48a, 48b, 50a, 50b, 52a, 52b, 54a, and 54b occurs on the present PIMM. As a result, the present invention eliminates the need for numerous connections between the present PIMM and a mother board. Thus, many of the electrical connectors typically shown as 56, in FIG. 3, are used for providing power and ground instead of transferring signals between the mother board and the present PIMM. The increased number of power and ground pins farther reduces the inductance of the present PIMM over prior art devices. This is beneficial due to the large transient current present during simultaneous switching.

Figure 5:
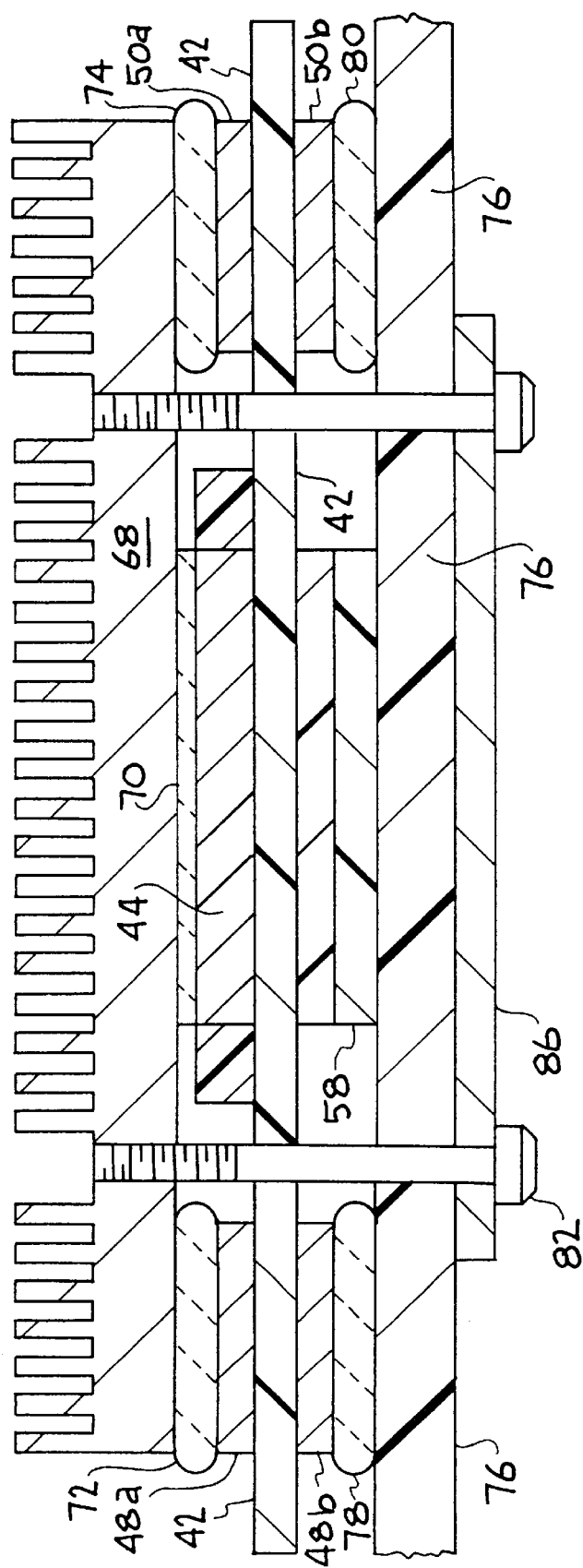
FIG. 5 is a side sectional view of one embodiment of the present processor-inclusive memory module (PIMM) coupled to a mother board in accordance with the present claimed invention.

With reference next to FIG. 5, a side sectional view of one embodiment of the present PIMM coupled to a mother board is shown. When processor 44 is operating at 200 MHz, power output is approximately 30 watts. Such power output must be dissipated to prevent processor 44 from burning up. In the present embodiment, a heat sink 68 is coupled to the top surface of processor 44. Heat sink 68 is thermally coupled to processor 44 by a thermal pad 70. Unlike the prior art, the present invention does not limit the size of the heat sink which can be attached thereto. That is, as shown in Prior Art FIG. 1, the size of the heat sink is limited by the presence of SIMMs 10 and 12. In the present PIMM, heat sink size limitations are removed.

With reference still to FIG. 5, when SSRAMs 46, 48a, 48b, 50a, 50b, 52a, 52b, 54a, and 54b are operating at 200 MHz, power output is approximately 2.3 watts. Such power output must be dissipated to prevent SSRAMs 46, 48a, 48b, 50a, 50b, 52a, 52b, 54a, and 54b from damaging themselves. Thus, in the embodiment of FIG. 5, heat sink 68 extends over the surface of the SSRAMs of the present PIMM. In the present embodiment, heat sink 68 is also thermally coupled to the top surface of, for example, SRAMS 48a and 50a by thermal pads 72 and 74, respectively. Low inductance spring contact 58 directly contacts a mother board 76. Excess heat present in low inductance spring contact 58 is then transferred and dissipated through mother board 76. Also, in the present embodiment, SSRAMs 48b and 50b are coupled to mother board 76 by thermal pads 78 and 80, respectively.

Referring still to FIG. 5, the present PIMM further includes screws, typically shown as 82 and 84. Screws 82 and 84 compress heat sink 68 towards mother board 76. The compression insure good electrical contact and efficient thermal transfer in the present PIMM. A stiffening plate 86 prevents mother board 76 from warping due to the compression.

Although not shown, the present invention is also well suited to having a serial PROM located on substrate 42. In an embodiment including a PROM, the serial PROM contains a unique identification number and vendor information.

The present PIMM further includes a system bus, not shown, which communicates with the mother board. The system bus leaving the PIMM operates at up to 100 MHz. Thus, as mentioned above, no high speed, i.e. 200 MHz signal transfer is required between processor 44 and mother board 76. In the present embodiment, almost all signals to and from processor 44 and cache, and also from processor 44 to mother board 76 will be HSTL. As an exception, the incoming clock signal will be differential LVPECL, and the JTAG will be LVTTL. SSRAMs 46, 48a, 48b, 50a, 50b, 52a, 52b, 54a, and 54b and processor 44 will have boundary scan, however SSRAMs 46, 48a, 48b, 50a, 50b, 52a, 52b, 54a, and 54b are not fully JTAG 1149.1 compliant. Furthermore, all input and output signals to processor 44 are HSTL except for the processor clock which is differential LVPECL. As a further exception, JTAG signals are LVTTL, and, in an embodiment which includes a serial PROM, the PROM line requires a separate protocol. System bus requirements in the present embodiment include a VDD of 3.3 volts to 3.6 volts, and a VDDQ of 1.4 volts to 1.6 volts.

In the present embodiment, the PIMM operates over a voltage range of 3.3V to 3.6V. Voltage required for VDDQ (HSTL) on the processor and SSRAM's is 1.5 volts+/−0.1 volts. The voltage required for line terminations is 1.5V+/− 0.1 volts. Additionally $V_{ref}$ for the input receivers is 0.75 volts and is generated on the present PIMM with a resistor/capacitor network.

Figure 6:
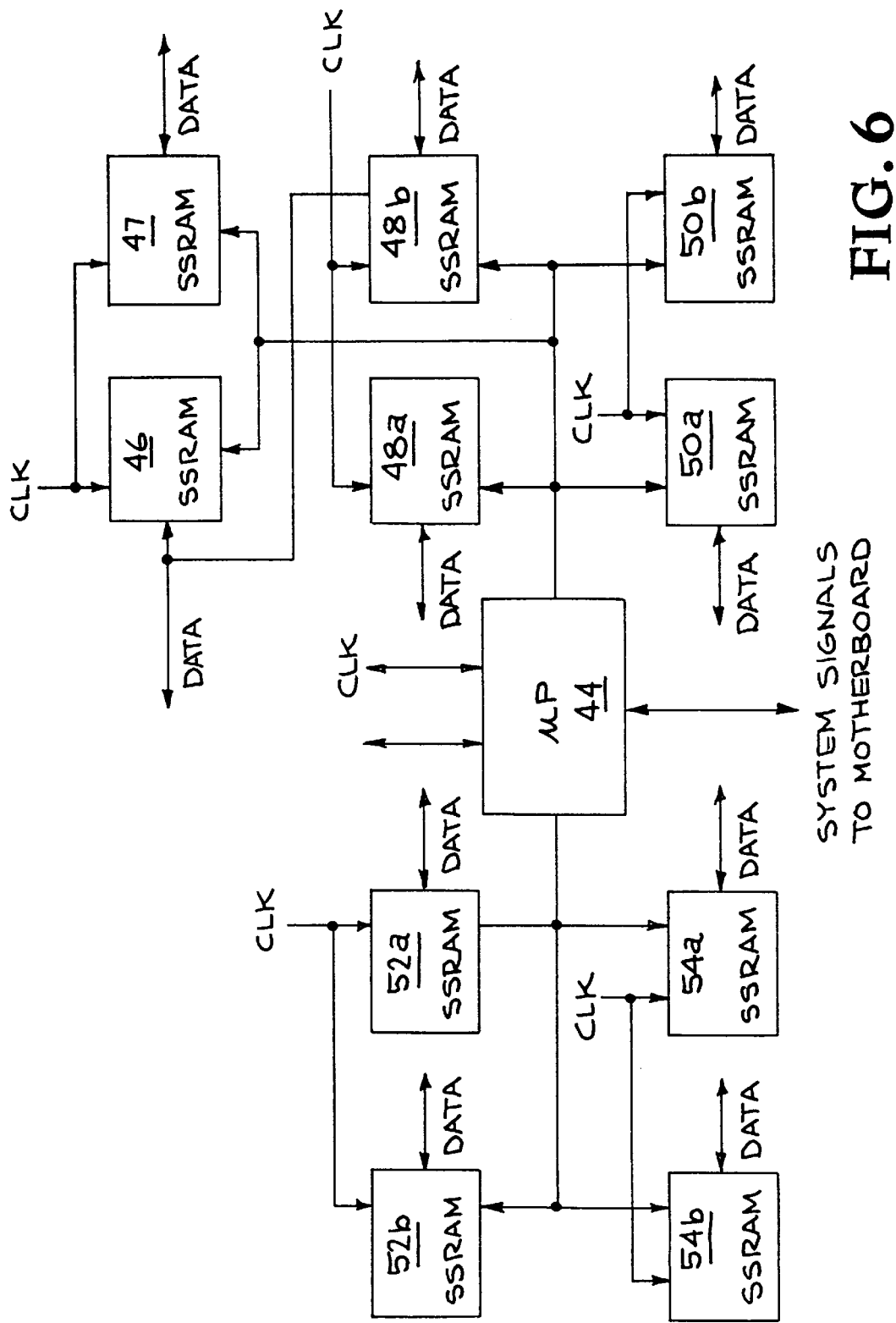
FIG. 6 shows a circuit diagram of the electrical layout of the PIMM.

FIG. 6 shows a circuit diagram of the electrical layout of the PIMM. The microprocessor is coupled to a secondary cache, which in the currently preferred embodiment, is comprised of ten 64K×18 SSRAMs 602–611. SSRAMs 604–607 reside on the same side of the printed circuit board. Whereas, SSRAMs 602–603 and 608–609 reside on the opposite site of the printed circuit board with respect to SSRAMs 604–607. SSRAM 610 is used to store the cache tag information. SSRAM 611 is an optional/empty socket. A number of clock lines CLK are used to clock SSRAMS 602–611 and microprocessor 601. In additon, address lines ADDR extend from microprocessor 601 to each of the SSRAMs 602–611. These address lines specify unique locations within the SSRAMS 602–611 that are to be accessed (i.e., read/write operations). Furthermore, a number of data lines DATA are used to write the data to or read the data from the SSRAMS 602–611. Lastly, the microprocessor 601 interfaces with the circuitry residing on the motherboard (not shown) via a host of system signals.

Thus, the present invention provides a memory module which does not require extended address lines or cache buses, a memory module which is capable of operating at speeds up to 200 MHz, and a memory module which is socketable.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A processor-inclusive memory module (PIMM) comprising:
   a printed circuit board having first and second opposing surfaces; said printed circuit board having an address line formed therein;
   first memory means mounted on said first surface of said printed circuit board, said first memory means coupled to said address line by a first cache bus;
   a second memory means mounted on said second surface of said printed circuit board, said second memory means coupled to said address line by a second cache bus, said first and second memory means mounted in a clamshelled orientation on said respective first and second surfaces of said printed circuit board, said first and second memory means mounted to said printed circuit board using a Ball Grid Array attachment configuration;
   processing means mounted on said first surface of said printed circuit board, said processing means coupled to said address line, said processing means having a plurality of contact pads disposed thereon;
   electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board; and
   cooling means thermally coupled to said processing means and said first memory means.

2. A processor-inclusive memory module (PIMM) comprising:
   a printed circuit board having first and second opposing surfaces; said printed circuit board having an address line formed therein;
   first memory means mounted on said first surface of said printed circuit board, said first memory means coupled to said address line by a first cache bus;
   a second memory means mounted on said second surface of said printed circuit board, said second memory means coupled to said address line by a second cache bus, said first and second memory means mounted in a clamshelled orientation on said respective first and second surfaces of said printed circuit board, said first and second memory means mounted to said printed circuit board using a Ball Grid Array attachment configuration;
   processing means mounted on said first surface of said printed circuit board, said processing means coupled to said address line, said processing means having a plurality of contact pads disposed thereon;
   electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board, said second memory means adapted to be thermally coupled to said mother board when said electrical connectors are coupled to said mother board; and
   cooling means thermally coupled to said processing means.

3. A processor-inclusive memory module (PIMM) comprising:
   a printed circuit board having first and second opposing surfaces; said printed circuit board having an address line formed therein;
   first memory means mounted on said first surface of said printed circuit board, said first memory means coupled to said address line by a first cache bus;
   a second memory means mounted on said second surface of said printed circuit board, said second memory means coupled to said address line by a second cache bus, said first and second memory means mounted in a clamshelled orientation on said respective first and second surfaces of said printed circuit board, said first and second memory means mounted to said printed circuit board using a Ball Grid Array attachment configuration, said first and second memory means comprised of synchronous memory means;
   processing means mounted on said first surface of said printed circuit board, said processing means coupled to said address line, said processing means having a plurality of contact pads disposed thereon;
   electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board; and
   cooling means thermally coupled to said processing means.

4. A processor-inclusive memory module (PIMM) comprising:
   a printed circuit board having first and second opposing surfaces; said printed circuit board having an address line formed therein;
   four first memory means mounted on said first surface of said printed circuit board, said four first memory means coupled to said address line by a first cache bus;
   four second memory means mounted on said second surface of said printed circuit board, said four second memory means mounted on said second surface of said printed circuit board directly opposite respective said four first memory means mounted on said first surface of said substrate, said four second memory means coupled to said address line by a second cache bus, said four first and four second memory means mounted in a clamshelled orientation on said respective first and second surfaces of said printed circuit board, said four first and four second memory means mounted to said printed circuit board using a Ball Grid Array attachment configuration;
   tag memory means mounted to said printed circuit board;
   processing means mounted on said first surface of said printed circuit board, said processing means coupled to said address line, said processing means having a plurality of contact pads disposed thereon;

electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board; and cooling means thermally coupled to said processing means.

5. A processor-inclusive memory module (PIMM) comprising:

a printed circuit board having first and second opposing surfaces; said printed circuit board having an address line formed therein;

first memory means mounted on said first surface of said printed circuit board, said first memory means coupled to said address line by a first cache bus;

a second memory means mounted on said second surface of said printed circuit board, said second memory means coupled to said address line by a second cache bus, said first and second memory means mounted in a clamshelled orientation on said respective first and second surfaces of said printed circuit board, said first and second memory means mounted to said printed circuit board using a Ball Grid Array attachment configuration;

processing means mounted on said first surface of said printed circuit board, said processing means coupled to said address line, said processing means having a plurality of contact pads disposed thereon, said processing means mounted on said printed circuit board using a low inductance spring contact;

electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board; and cooling means thermally coupled to said processing means.

6. A processor-inclusive memory module (PIMM) comprising:

a printed circuit board having first and second opposing surfaces; said printed circuit board having an address line formed therein;

first memory means mounted on said first surface of said printed circuit board, said first memory means coupled to said address line by a first cache bus;

a second memory means mounted on said second surface of said printed circuit board, said second memory means coupled to said address line by a second cache bus, said first and second memory means mounted in a clamshelled orientation on said respective first and second surfaces of said printed circuit board, said first and second memory means mounted to said printed circuit board using a Ball Grid Array attachment configuration;

processing means mounted on said first surface of said printed circuit board, said processing means coupled to said address line, said processing means having a plurality of contact pads disposed thereon;

electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board;

probe test points and high-frequency test probes disposed on said printed circuit board for testing said processing means and said first and second memory means; and cooling means thermally coupled to said processing means.

7. A processor-inclusive memory module (PIMM) comprising:

a printed circuit board having first and second opposing surfaces; said printed circuit board having an address line formed therein;

first memory means mounted on said first surface of said printed circuit board, said first memory means coupled to said address line by a first cache bus;

a second memory means mounted on said second surface of said printed circuit board, said second memory means coupled to said address line by a second cache bus, said first and second memory means mounted in a clamshelled orientation on said respective first and second surfaces of said printed circuit board, said first and second memory means mounted to said printed circuit board using a Ball Grid Array attachment configuration;

processing means mounted on said first surface of said printed circuit board, said processing means coupled to said address line, said processing means having a plurality of contact pads disposed thereon, said processing means and said first and second memory means adapted to access said address line using said first and second cache buses at a speed of up to 200 MHz;

electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board; and cooling means thermally coupled to said processing means.

8. A processor-inclusive memory module (PIMM) comprising:

a printed circuit board having first and second opposing surfaces; said printed circuit board having an address line formed therein;

four first memory means mounted on said first surface of said printed circuit board, said four first memory means coupled to said address line by a first cache bus;

four second memory means mounted on said second surface of said printed circuit board, said four second memory means mounted on said second surface of said printed circuit board directly opposite respective said four first memory means mounted on said first surface of said substrate, said four second memory means coupled to said address line by a second cache bus, said four first and four second memory means mounted in a clamshelled orientation on said respective first and second surfaces of said printed circuit board, said four first and four second memory means mounted to said printed circuit board using a Ball Grid Array attachment configuration, two of said first memory means and two of said second memory means coupled to said address line by four respective cache buses coupled thereto such that two of said first memory means and two of said second memory means share a common address line;

tag memory means mounted to said printed circuit board;

processing means mounted on said first surface of said printed circuit board, said processing means coupled to said address line, said processing means having a plurality of contact pads disposed thereon;

electrical connectors disposed on said second surface of said printed circuit board, said electrical connectors electrically coupleable to respective said contact pads of said processing means, said electrical connectors adapted to be removably attached to a mother board such that said printed circuit board, with said first and second memory means and said processing means mounted thereto, is removably attachable to said mother board; and cooling means thermally coupled to said processing means.

* * * * *